United States Patent
Fenouillet-Beranger et al.

(10) Patent No.: US 9,337,302 B2
(45) Date of Patent: May 10, 2016

(54) ON-SOI INTEGRATED CIRCUIT COMPRISING A SUBJACENT PROTECTION TRANSISTOR

(71) Applicants: Commissariat à l'énergie atomique et aux énergies alternatives, Paris (FR); STMicroelectronics SA, Crolles (FR)

(72) Inventors: Claire Fenouillet-Beranger, Grenoble (FR); Pascal Fonteneau, Theys (FR)

(73) Assignees: Commissariat à l'énergie atomique et aux énergies alternatives, Paris (FR); STMicroelectronics SA, Mountrouge (FR)

( * ) Notice: Subject to any disclaimer, the term of this patent is extended or adjusted under 35 U.S.C. 154(b) by 289 days.

(21) Appl. No.: 13/933,379

(22) Filed: Jul. 2, 2013

(65) Prior Publication Data

US 2014/0017856 A1  Jan. 16, 2014

(30) Foreign Application Priority Data

Jul. 13, 2012  (FR) ..................................... 12 56804

(51) Int. Cl.
*H01L 29/66* (2006.01)
*H01L 27/02* (2006.01)
*H01L 27/12* (2006.01)
*H01L 27/06* (2006.01)

(52) U.S. Cl.
CPC ...... *H01L 29/66477* (2013.01); *H01L 27/0296* (2013.01); *H01L 27/1207* (2013.01); *H01L 27/0688* (2013.01)

(58) Field of Classification Search
CPC ............ H01L 27/0248; H01L 27/0296; H01L 27/1207
See application file for complete search history.

(56) References Cited

U.S. PATENT DOCUMENTS

| | | | | |
|---|---|---|---|---|
| 5,923,067 | A * | 7/1999 | Voldman | ........................ 257/349 |
| 2006/0027877 | A1 | 2/2006 | Inaba | |
| 2007/0063284 | A1 | 3/2007 | Kawahara et al. | |
| 2009/0003105 | A1* | 1/2009 | Itoh et al. | ....................... 365/203 |
| 2009/0134468 | A1 | 5/2009 | Tsuchiya et al. | |
| 2012/0056273 | A1 | 3/2012 | Ishii et al. | |

FOREIGN PATENT DOCUMENTS

JP        56-162875        12/1981

* cited by examiner

*Primary Examiner* — Marvin Payen
*Assistant Examiner* — Victor Barzykin
(74) *Attorney, Agent, or Firm* — Occhiuti & Rohlicek LLP

(57) ABSTRACT

An integrated circuit features a FET, an UTBOX layer plumb with the FET, an underlayer ground plane with first doping plumb with the FET's gate and channel, first and second underlayer semiconducting elements, both plumb with the drain or source, electrodes in contact respectively with the ground plane and with the first element, one having first doping and being connected to a first voltage, the other having the first doping and connected to a second bias voltage different from the first, a semiconducting well having the second doping and plumb with the first ground plane and both elements, a first trench isolating the first FET from other components of the integrated circuit and extending through the layer into the well, and second and third trenches isolating the FET from the electrodes, and extending to a depth less than a plane/well interface.

12 Claims, 2 Drawing Sheets

US 9,337,302 B2

ON-SOI INTEGRATED CIRCUIT COMPRISING A SUBJACENT PROTECTION TRANSISTOR

RELATED APPLICATIONS

Under 35 USC 119, this application claims the benefit of the priority date of French Application No. 1256804, filed on Jul. 13, 2012, the contents of which are herein incorporated by reference.

FIELD OF INVENTION

The invention relates to integrated circuits, and in particular to integrated circuits produced on a substrate of silicon-on-insulator (SOI) type. SOI technology consists in separating a slender silicon layer (a few nanometers) on a silicon substrate by a relatively thick layer of insulant (a few tens of nanometers as a general rule).

BACKGROUND

Integrated circuits produced by SOI technology exhibit a certain number of advantages. Such circuits generally exhibit lower electrical consumption for equivalent performance. Such circuits also induce lower parasitic capacitances, which make it possible to improve switching speed. Moreover, the phenomenon of parasitic triggering ("latchup") encountered by MOS transistors in Bulk technology can be avoided. Such circuits therefore turn out to be particularly suitable for applications of SoC or MEMS type. It is also noted that SOI integrated circuits are less sensitive to the effects of ionizing radiations and thus turn out to be more reliable in applications where such radiations may induce operational problems, in particular in space applications. SOI integrated circuits can in particular comprise random-access memories of SRAM type or logic gates.

The reduction in the static consumption of logic gates while increasing their switching speed forms the subject of much research. In the course of development, certain integrated circuits integrate at one and the same time logic gates with low consumption and logic gates with high switching speed. To generate these two types of logic gates on one and the same integrated circuit, the threshold voltage of certain transistors of the logic gates with fast access is lowered, and the threshold voltage of other transistors of the logic gates with low consumption is increased. In Bulk technology, the modulation of the threshold voltage level of transistors of the same type is performed by differentiating the doping level of their channel. However, in FDSOI (for "Fully Depleted Silicon On Insulator") technology, the doping of the channel is almost zero ($10^{15}$ $cm^{-3}$). Thus, the doping level of the channel of the transistors therefore cannot exhibit any significant variations, thus preventing the threshold voltages from being differentiated in this way. A solution proposed in certain studies in order to produce transistors of the same type with distinct threshold voltages is to integrate different gate materials for these transistors. However, the practical production of an integrated circuit such as this turns out to be technically tricky and economically prohibitive.

SUMMARY OF THE INVENTION

In order to have distinct threshold voltages for different transistors in FDSOI technology, it is also known to use a biased ground plane disposed between a thin insulating oxide layer and the silicon substrate. By altering the doping of the ground planes and their bias, it is possible to define a range of threshold voltages for the different transistors. It will thus be possible to have transistors with low threshold voltage termed LVT, transistors with high threshold voltage termed HVT and transistors with medium threshold voltage termed SVT.

To allow the operation of the different transistors, it is necessary to electrically insulate them from each other. Consequently, the transistors are generally surrounded by isolation trenches (designated by the acronym STI for "Shallow Trench Isolation") which extend into the wells.

In a known manner, integrated circuits such as these also include devices for protection against accidental electrostatic discharges (ESD) that might impair these transistors.

The document US2012/056273 describes an integrated circuit comprising a field-effect transistor disposed on a buried insulating layer. A ground plane is disposed plumb with the gate and with the channel of the transistor, under the buried insulating layer.

There exists a need for devices for protection against electrostatic discharges affecting integration density only marginally, making it possible to divert a significant discharge current, and making it possible potentially to ensure local protection of the integrated circuit. The invention thus pertains to an integrated circuit such as defined in the appended claims.

BRIEF DESCRIPTION OF THE DRAWINGS

Other characteristics and advantages of the invention will emerge clearly from the description thereof given hereinafter, by way of wholly nonlimiting indication, with reference to the appended drawings, in which.

DETAILED DESCRIPTION OF THE INVENTION

The invention proposes to use, in an integrated circuit, isolation trenches of reduced depth and dimensions to produce an ESD protection device for the integrated circuit. Such a protection device is formed of a transistor, located under an electronic component. This protection device is therefore not detrimental to the integration density of the circuit and makes it possible to ensure protection against electrostatic discharges by diverting a significant discharge current.

Figure 1:
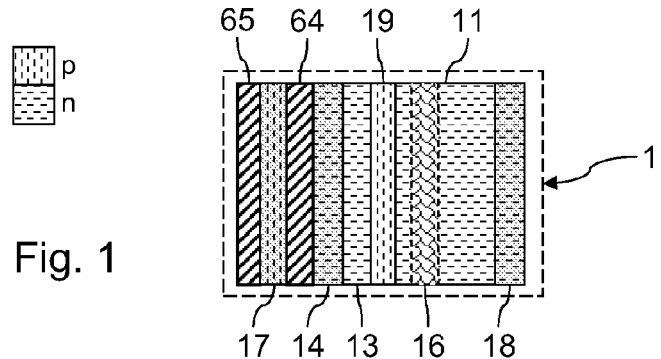
FIG. 1 is a schematic top view of a portion of integrated circuit according to a first embodiment of the invention.
Figure 2:
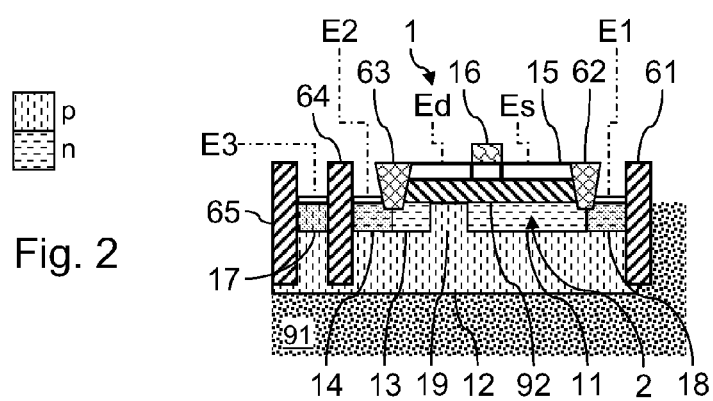
FIG. 2 illustrates a cross-sectional view of the integrated circuit of FIG. 1.

FIG. 1 is a schematic top view of a portion of an integrated circuit fabricated on SOI, in section at the level of ground planes and implanted areas. The integrated circuit here comprises a field-effect transistor 1. FIG. 2 is a cross-sectional view of the integrated circuit. The transistor 1 is produced in a layer of a semi-conducting material, termed the active layer, formed on an insulating layer 92, this insulating layer 92 being formed plumb with a semi-conducting substrate 91, typically with doping of type p.

The transistor 1 is for example an nMOS transistor. The nMOS transistor is generally aligned with other nMOS transistors in a row of cells, each cell including an nMOS transistor and a pMOS transistor.

The transistor 1 comprises in a manner known per se a source, a drain and a channel, and a gate stack produced plumb with the channel. The source, the drain and the channel of the transistor 1 are made in the semi-conducting active layer 15. The transistor 1 comprises a gate stack 16 disposed on the semi-conducting active layer 15, plumb with its channel. The transistor of the active layer can in a manner known per se be of FDSOI type (for "Fully Depleted Silicon On Insulator") with a channel made of weakly doped semi-conducting material, the channel having a concentration of dopants that is substantially equal to the concentration of dopants of the substrate 91. The transistor 1 also comprises source and drain electrodes, not illustrated, to which the potentials Es and Ed are respectively applied.

A semi-conducting ground plane 11 is formed plumb with the transistor 1, under the buried insulating layer 92. The doping of the ground plane 11 is of type n. The ground plane 11 extends under the major part of the buried insulating layer. The ground plane 11 extends plumb with the gate stack 16 and with the channel of the transistor 1.

The ground plane 11 is biased by a semi-conducting implanted area 18 (i.e. a first bias electrode), to a potential E1. The implanted area 18 presents a doping of type n (and preferably an N+ doping). The biasing of the ground plane 11 can be performed by way of a bias circuit, not represented here.

An isolation trench 62 is made plumb with the contact between the ground plane 11 and the implanted area 18. The isolation trench 62 here passes through the insulating layer 92 and therefore extends into the ground plane 11. The trench 62 does not reach the bottom of the ground plane 11 or of the implanted area 18, in order to preserve a contact between them. The isolation trench 62 makes it possible to improve the insulation between the transistor 1 and the implanted area 18.

Isolation trenches 61 and 65 (i.e. a first isolation trench) are moreover made at the periphery, in order to isolate the transistor 1, with respect to the subjacent elements, which will be detailed, and with respect to the electrodes of these elements. The isolation trench 61 is made at the level of a boundary of the implanted area 18. The trench 61 extends through the buried insulating layer 92 into the well 12, without reaching the substrate 91. The trench 61 can present the same depth as the trench 62 (i.e. a second isolation trench) so as to form a lateral protection diode.

A semi-conducting zone 13 (i.e. a first semiconducting element) is formed plumb with the transistor 1, under the buried insulating layer 92. The doping of the zone 13 is of type n. The zone 13 is placed plumb with the drain of the transistor 1, at the level of a boundary of this transistor. The zone 13 is offset laterally with respect to the gate stack 16.

The zone 13 is biased by a semi-conducting implanted area 14 (i.e. a second bias electrode), to a potential E2. The implanted area 14 presents a doping of type n (and preferably an N+ doping). The biasing of the zone 13 can be performed by way of the bias circuit mentioned previously.

An isolation trench 63 (i.e. a third isolation trench) is made plumb with the contact between the zone 13 and the implanted area 14. The isolation trench 63 here passes through the insulating layer 92 and therefore extends into the zone 13. The isolation trench 63 advantageously presents the same depth as the isolation trench 62. The trench 63 does not reach the bottom of the zone 13 or of the implanted area 14, in order to preserve a contact between them. The isolation trench 63 makes it possible to improve the insulation between the transistor 1 and the implanted area 14.

A semi-conducting well 12 is formed plumb with the ground plane 11 and with the zone 13. The doping of the well 12 is of type p. The well 12 extends laterally plumb with the implanted areas 14 and 18. The well 12 furthermore comprises a portion 19 (i.e. a second semiconductor element) extending vertically upwards and separating the zone 13 from the ground plane 11. The portion 19 forms a lower channel between the zone 13 and the ground plane 11. The lower channel 19 is offset laterally with respect to the gate stack 16, and disposed plumb with an electrode of the transistor 1 (in this instance the drain). The zone 19 can present a width of 0.2 µm, and is advantageously between 0.1 and 0.3 µm. The zone 19 can present a thickness equivalent to the thickness of the ground plane 11.

The bottoms of the implanted areas 14 and 18 are in contact with the well 12. The implanted area 18 makes it possible at one and the same time to bias the ground plane 11, and to form an electrode for a device for protection against the electrostatic discharges between two potentials. The implanted area 14 forms another electrode for this protection device.

The well 12 is biased by a semi-conducting implanted area 17, to a potential E3. The implanted area 17 presents a doping of type p (and preferably of P+ doping). The biasing of the well 12 can be performed through the bias circuit mentioned previously. The bottom of the implanted area 17 is in contact with the well 12.

The implanted area 17 is made between the isolation trench 65 and an isolation trench 64. The isolation trenches 64 and 65 extend through the buried insulating layer 92 into the well 12, without reaching the substrate 91. The well 12 thus extends laterally until plumb with the implanted area 17, under the isolation trenches 62, 63 and 64. The isolation trenches 64 and 65 advantageously present one and the same depth.

The implanted areas 14, 17 and 18 are coplanar with the ground plane 11, with the lower channel 19, and with the zone 13. By Coplanar it is meant that it is possible to define a plane parallel to the layer 92 and passing through the zones concerned.

The buried insulating layer 92, in a manner known per se, electrically isolates the transistor 1 from its ground plane 11, from its well 12, and from the substrate 91. The substrate 91 can for example be biased to a ground voltage Gnd.

The buried insulating layer 92 formed plumb with the transistor is here of UTBOX ("Ultra-Thin Buried Oxide Layer") type. Thus, the control of the bias of the ground plane 11 (also called the back gate) makes it possible to modulate the threshold voltage of the transistor 1. The ground plane 11 extending under the channel of the transistor 1, its bias makes it possible to influence the threshold voltage of this transistor. The insulating layer 92 s presents for example a thickness less than or equal to 60 nm, less than or equal to 50 nm, or indeed less than or equal to 20 nm. The insulating layer 92 can be produced in a manner known per se from silicon oxide.

A subjacent field-effect transistor 2 of nMOS type is thus formed under the transistor 1. The drain of this transistor 2 is here formed by the association of the implanted area 14 and of the zone 13, and its source is formed by the association of the implanted area 18 and of the ground plane 11. The lower channel 19 forms the channel of this transistor 2. The buried insulating layer 92 is here used as gate insulator. An electrode of the transistor 1, here the drain, is used as gate for this transistor 2. By an appropriate bias of the drain of the transistor 1, the electric field generated on the lower channel 19 makes it possible to render the latter passing. Thus, in the presence of an electrostatic discharge, the transistor 2 can be rendered passing to ensure a discharge between the potentials E1 and E2 (corresponding for example to potentials defined by power supply rails of the integrated circuit) through the well 12, and thus protect components connected between these potentials.

The depth of the trenches 62 and 63 makes it possible to adjust the transistor 2 drain and source access resistances. The depth of the trenches 62 and 63 therefore also makes it possible to adjust the ballast resistance in the case of triggering of the phenomenon of "snapback", allowing uniformization of the discharge current.

The well 12 can present concentrations of dopants between $10^{16}$ cm$^{-3}$ and $10^{18}$ cm$^{-3}$. The ground plane 11 and the zone 13 can present concentrations of dopants of between $10^{18}$ cm$^{-3}$ and $10^{19}$ cm$^{-3}$. The lower channel 19 will be able to present a dopants concentration identical to those of the ground plane 11 and of the zone 13 or of the well 12. The well 12 can extend to a depth of less than 1 μm and, preferably, less than or equal to 700 nm.

Metallic contacts can be deposited after silicidation directly on each of the implanted areas 14, 17 and 18, in order to allow electrical connection of each of them. Advantageously, the implanted areas 14, 17 and 18 each a concentration of dopants at least fifty times, or a hundred times greater than the concentration of dopants of the well 12. For example, the implanted areas 14, 17 and 18 present concentrations of dopants that are advantageously greater than or equal to $5*10^{18}$ cm$^{-3}$ and, preferably, between $10^{19}$ cm$^{-3}$ and $10^{21}$ cm$^{-3}$. These concentrations of dopants are for example substantially equal to the concentrations of dopants of the source or of the drain of the transistor 1. The implanted areas 14, 17 and 18 are made laterally with respect to the transistor 1.

Figure 3:
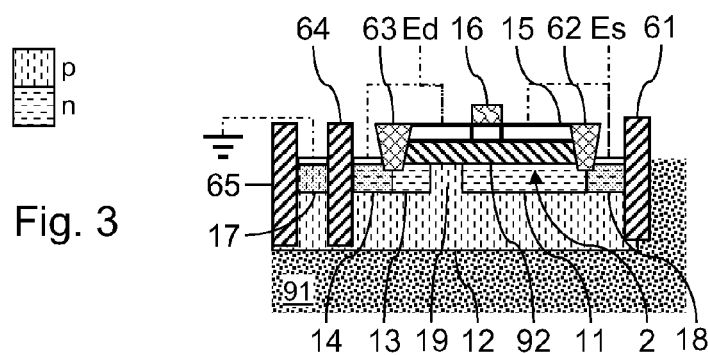
FIG. 3 illustrates a cross-sectional view of a particular case of the integrated circuit of FIG. 1.

FIG. 3 is a cross-sectional view of a particular case of configuration of the integrated circuit of FIGS. 1 and 2. In this example, the drain potential Ed is applied to the implanted area 14, and the source potential Es is applied to the implanted area 18. A ground potential Gnd is here applied to the implanted area 17 and to the semi-conducting substrate 91.

Figures 4, 5:
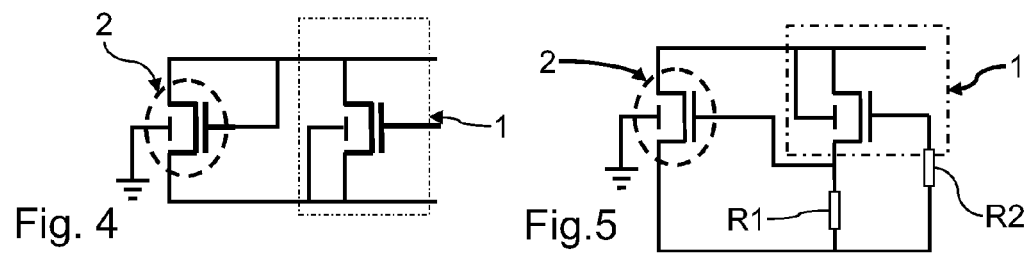
FIG. 4 is an electrical diagram of an example of application of the integrated circuit of FIG. 3.
FIG. 5 is an electrical diagram of an exemplary application of a variant of the integrated circuit of FIG. 3.

FIG. 4 is an electrical diagram of an example of application of the integrated circuit of FIG. 3. The nMOS transistor 1 is here an electronic component that it is desired to protect locally against electrostatic discharges. As detailed previously, the drain of the transistor 1 is used as gate of the transistor 2. The drains of the transistors 1 and 2 are at the potential Ed and the sources of the transistors 1 and 2 are at the potential Es. The substrate 91 is used as body of the transistor 2 biased to the potential Gnd. The well 12 can also be insulated from the substrate 91 by using a deep insulation layer. The body of the transistor 2 can then be biased with a different potential from the substrate 91 which is grounded.

Upon a rise in the potential Ed, possibly induced by an electrostatic discharge, the transistor 2 closes to divert the electrostatic discharge under the transistor 1, between the potentials Ed and Es. The transistor 2 thus ensures local protection against electrostatic discharges, making it possible to divert a significant discharge current with a reduced triggering time. The transistor 2 formed being in major part placed under the transistor 1, it induces only a limited decrease in integration density for the integrated circuit.

FIG. 5 is an electrical diagram of another application for a variant of the integrated circuit of FIG. 3. In this variant, the nMOS transistor 1 is intended to control the transistor 2 formed, so as to ensure centralized protection for other components of the integrated circuit, between the potentials Ed and Es.

The substrate 91 is biased to the ground potential Gnd. The ground plane 11 of the transistor 1 is here made plumb with its drain, the zone 13 is made plumb with its source, the zone 19 is made plumb with its source and is offset laterally with respect to the gate stack 16. Thus, the source of the transistor 1 is used as gate of the transistor 2. The drain of the transistor 1 and the implanted area 14 are biased to the potential Ed. The source of the transistor 1 and the implanted area 18 are biased to the potential Es.

In the case of a well 12 insulated from the substrate 91 by a deeply buried well, the body of the transistor 2 can also be connected to the gate and therefore to the potential Es, thereby lowering the threshold voltage of the transistor 2.

A resistance R1 is formed between the source of the transistor 1 and the potential Es. A resistance R2 is formed between the gate of the transistor 1 and the potential Ed. An electrostatic discharge inducing a rise in the potential Es closes the transistor 1, and causes the transistor 2 to close. The transistor 1 thus makes it possible to control the closing of the transistor 2 in the presence of such an electrostatic discharge.

Figure 6:
FIG. 6 illustrates a cross-sectional view of another embodiment of an integrated circuit.
Figure 6:
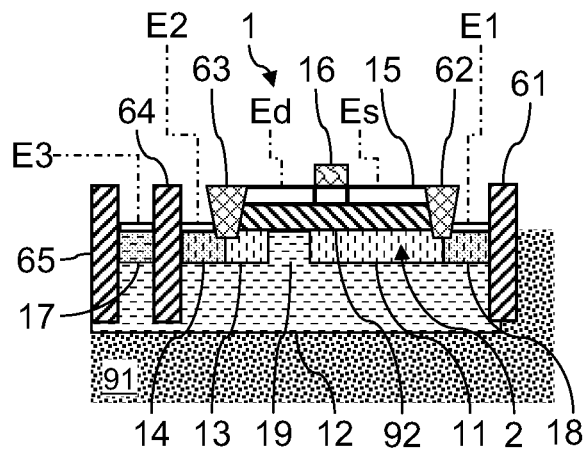

FIG. 6 is a cross-sectional view of another embodiment of an integrated circuit. The field-effect transistor 1 is produced in the active layer 15, formed on the insulating layer 92, formed plumb with the semi-conducting substrate 91 (with doping of type p). The transistor 1 is also of the FDSOI type. The transistor 1 comprises a source, a drain and a channel, and a gate stack 16 produced plumb with the channel. The source, the drain and the channel of the transistor 1 are made in the active layer 15. Potentials Es and Ed are applied respectively to the source and drain electrodes of the transistor 1.

The semi-conducting ground plane 11 (formed plumb with the transistor 1 under the buried insulating layer 92) presents a doping of type p. The ground plane 11 extends under the major part of the buried insulating layer. The ground plane 11 extends plumb with the gate stack 16 and with the channel of the transistor 1.

The ground plane 11 is biased by the semi-conducting implanted area 18, to a potential E1. The implanted area 18 presents a doping of type p (and preferably a P+ doping).

The isolation trench 62 is made plumb with the contact between the ground plane 11 and the implanted area 18. The isolation trench 62 here passes through the insulating layer 92 and therefore extends into the ground plane 11. The trench 62 does not reach the bottom of the ground plane 11 or of the implanted area 18, in order to preserve a contact between them.

The isolation trenches 61 and 65 are moreover made at the periphery, in order to isolate the transistor 1, with respect to the subjacent elements, and with respect to the electrodes of these elements. The isolation trench 61 is made at the level of a boundary of the implanted area 18. The trench 61 here presents the same depth as the trench 64, and therefore extends through the insulating layer 62 and into contact with the implanted area 18.

The semi-conducting zone 13 (formed plumb with the transistor 1, under the buried insulating layer 92) presents a doping of type p. The zone 13 is placed plumb with the drain of the transistor 1, at the level of a border of this transistor. The zone 13 is offset laterally with respect to the gate stack 16.

The zone 13 is biased by the semi-conducting implanted area 14, to a potential E2. The implanted area 14 presents a doping of type p (and preferably a P+ doping).

The isolation trench 63 is made plumb with the contact between the zone 13 and the implanted area 14. The isolation trench 63 here passes through the insulating layer 92 and therefore extends into the zone 13. The isolation trench 63 advantageously presents the same depth as the isolation trench 62. The trench 63 does not reach the bottom of the zone 13 or of the implanted area 14, in order to preserve a contact between them.

The semi-conducting well 12 is formed plumb with the ground plane 11 and with the zone 13. The doping of the well 12 is of type n. The well 12 extends laterally plumb with the implanted areas 14 and 18. The portion 19 of the well 12 extends vertically upwards and separates the zone 13 from the ground plane 11. The portion 19 forms a lower channel between the zone 13 and the ground plane 11. The lower channel 19 is offset laterally with respect to the gate stack 16, and disposed plumb with an electrode of the transistor 1 (in this instance the drain).

The bottoms of the implanted areas 14 and 18 are in contact with the well 12. The implanted area 18 makes it possible at one and the same time to bias the ground plane 11, and to form an electrode for a device for protection against the electrostatic discharges between two potentials. The implanted area 14 forms another electrode for this protection device.

The well 12 is biased by the semi-conducting implanted area 17, to a potential E3. The implanted area 17 presents a doping of type n (and preferably of N+ doping). The bottom of the implanted area 17 is in contact with the well 12.

The implanted area 17 is made between the isolation trench 65 and the isolation trench 64. The isolation trenches 64 and 65 extend through the buried insulating layer 92 into the well 12, without reaching the substrate 91. The well 12 thus extends laterally until plumb with the implanted area 17, under the isolation trenches 62, 63 and 64. The isolation trenches 64 and 65 advantageously presents one and the same depth. The implanted areas 14, 17 and 18 are coplanar with the ground plane 11, with the lower channel 19, and with the zone 13.

The transistor 2 thus formed is thus a field-effect transistor of pMOS type whose gate is formed by the drain of the transistor 1.

Figure 7:
FIG. 7 illustrates a cross-sectional view of a variant of the integrated circuit of FIG. 1.
Figure 7:
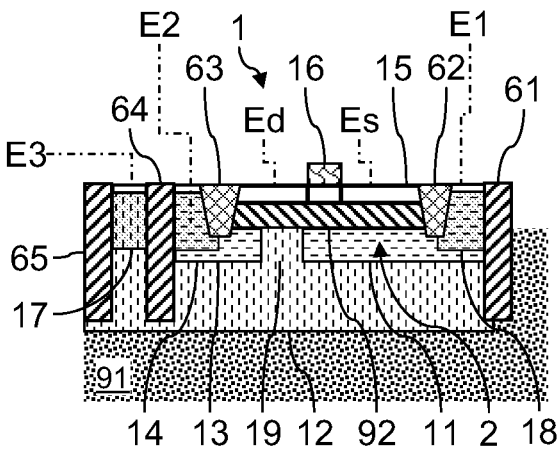

FIG. 7 is a cross-sectional view of a variant of the circuit of FIG. 2. In this variant, a resumption of epitaxy can be performed on the implanted areas 14, 17 and 18, to avoid the altitude difference with the active layer 15. In this example, the implanted areas 14 and 18 extend more deeply than the layer 92, and more deeply than the isolation trenches 62 and 63.

The previously illustrated subjacent protection transistors are of the field-effect type. However, by using a zone 19 of appropriate dimension and appropriate doping, it is possible to achieve the subjacent protection in the form of a bipolar transistor in order to use the phenomenon of "snapback" to evacuate the electrostatic discharge. The collector of the bipolar transistor is then formed by the implanted area 18 and by the ground plane 11, the emitter of the bipolar transistor is formed by the implanted area 14 and by the zone 13, and the base of this transistor is formed by the well 12, connected to the potential E3 by way of the implanted area 17.

The invention claimed is:

1. A semiconductor device comprising an integrated circuit, said integrated circuit comprising a first field-effect transistor and other electronic components, said first field-effect transistor having a drain and a source, a buried insulating layer, of UTBOX type, formed plumb with said first field-effect transistor, a ground plane made plumb with a gate and with a channel of said first field-effect transistor, said ground plane being disposed under said buried insulating layer and having a first type of doping, a first semiconducting element made under said buried insulating layer, said first semiconducting element having said first type of doping, a second semiconducting element made under said buried insulating layer and offset laterally with respect to said gate of said first field-effect transistor, said second semiconducting element being in contact with and separating said ground plane and said first semiconducting element, said second semiconducting element having a second type of doping opposite to said first type of doping, said first and second semiconducting elements being made plumb with one of said source and said drain of said first field-effect transistor, first and second bias electrodes in contact respectively with said ground plane and with said first semiconducting element, said first bias electrode having said first type of doping and being connected to a first bias voltage, said second bias electrode having said first type of doping and being connected to a second bias voltage different from said first voltage, a semiconducting well having said second type of doping and made plumb with said first ground plane and with said first and second semiconducting elements, a first isolation trench isolating said first field-effect transistor from said other electronic components of said integrated circuit, said first isolation trench extending through said buried insulating layer and into said semiconducting well, and second and third isolation trenches isolating said first field-effect transistor respectively from said first and second bias electrodes, and extending to a depth strictly less than the depth of said ground plane, wherein said ground plane and said first and second semiconducting elements are included in a field-effect transistor whose gate is formed by one of said drain and said source plumb with which said first and second semiconducting elements are formed.

2. The semiconductor device of claim 1, wherein said second bias electrode is connected electrically to one of said drain and said source with which said first and second semiconducting elements are made plumb, and wherein said first bias electrode is connected electrically to one of said drain and said source of said first field-effect transistor.

3. The semiconductor device of claim 2, wherein said first bias electrode is connected electrically to said source of said first field-effect transistor, and wherein said second bias electrode is connected electrically to said drain of said first field-effect transistor.

4. The semiconductor device of claim 1, further comprising a third electrode in contact with said semiconducting well, and a fourth isolation trench isolating said third electrode from said first and second bias electrodes and extending through said buried insulating layer and into said semiconducting well.

5. The semiconductor device of claim 4, wherein said third electrode is biased to a ground potential.

6. The semiconductor device claim 1, wherein said first field-effect transistor is an FDSOI field-effect transistor.

7. The semiconductor device of claim 1, wherein said first field-effect transistor is an nMOS transistor.

8. The semiconductor device of claim 1, wherein said first type of doping is n-type doping.

9. The semiconductor device of claim 1, wherein said first type of doping is p-type doping.

10. The semiconductor device of claim 1, wherein said first and second bias electrodes each comprise a semiconducting implanted area having a concentration of dopants at least fifty times greater than a concentration of dopants in said semiconducting well.

11. The semiconductor device of claim 1, wherein said first and second semiconducting elements and said ground plane all have identical dopant concentrations.

12. The semiconductor device of claim 1, wherein said first and second bias electrodes each have an upper part that is flush with an upper part of said second isolation trench.

* * * * *